(12) United States Patent
Ishige

(10) Patent No.: US 6,515,326 B2
(45) Date of Patent: Feb. 4, 2003

(54) SEMICONDUCTOR MEMORY DEVICE AND METHOD OF FABRICATING THE SAME

(75) Inventor: Kiyokazu Ishige, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/887,072

(22) Filed: Jun. 25, 2001

(65) Prior Publication Data

US 2001/0054736 A1 Dec. 27, 2001

(30) Foreign Application Priority Data

Jun. 26, 2000 (JP) ........................................ 2000-191740

(51) Int. Cl.[7] ..................... H01L 21/8247; H01L 29/76; H01L 29/94
(52) U.S. Cl. ..................... 257/298; 257/309; 257/316; 438/258
(58) Field of Search ................................ 438/257–267; 257/298, 309, 316–321

(56) References Cited

U.S. PATENT DOCUMENTS

| 5,908,311 A | * | 6/1999 | Chi et al. | 438/258 |
| 5,970,338 A | * | 10/1999 | Tempel | 438/152 |
| 6,323,514 B1 | * | 11/2001 | Kao | 257/315 |
| 6,420,222 B1 | * | 7/2002 | Watanabe | 438/201 |

FOREIGN PATENT DOCUMENTS

| TW | 376534 | 12/1999 |
| TW | 2000-191740 | 6/2000 |

OTHER PUBLICATIONS

Taiwanese Office Action dated Jul. 3, 2002 with partial translation.

* cited by examiner

*Primary Examiner*—Richard Booth
(74) *Attorney, Agent, or Firm*—McGinn & Gibb, PLLC

(57) ABSTRACT

A semiconductor memory device is provided, which makes it possible to increase the capacitance of capacitors in the capacitor section without degrading the withstand voltage of the capacitor dielectric. This device comprises a memory cell section including floating-gate type transistors and a capacitor section including capacitors. The memory cell section and the capacitor section are formed on a semiconductor substrate. Each of the transistors has a first gate dielectric, a floating gate, a second gage dielectric, and a control gate. Each of the capacitors has a lower electrode, a capacitor dielectric, and an upper electrode. A first part of the capacitors is/are designed to be applied with a first voltage and a second part thereof is/are applied with a second voltage on operation, where the first voltage is lower than the second voltage. Each of the first part of the capacitors has a recess formed on the lower electrode, thereby increasing its capacitance.

5 Claims, 12 Drawing Sheets

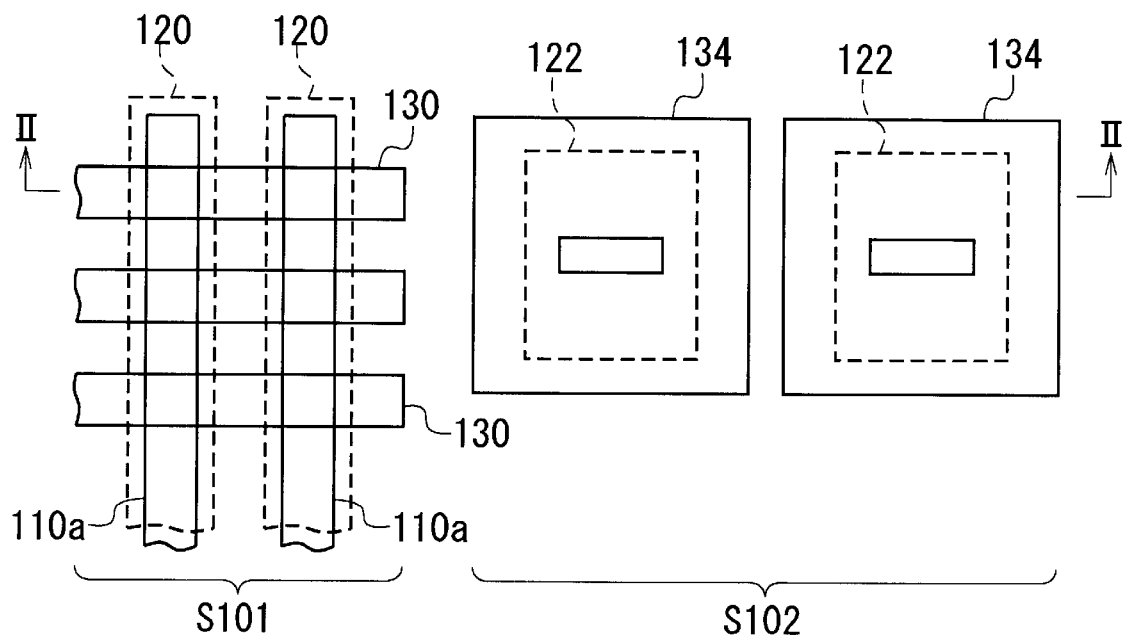
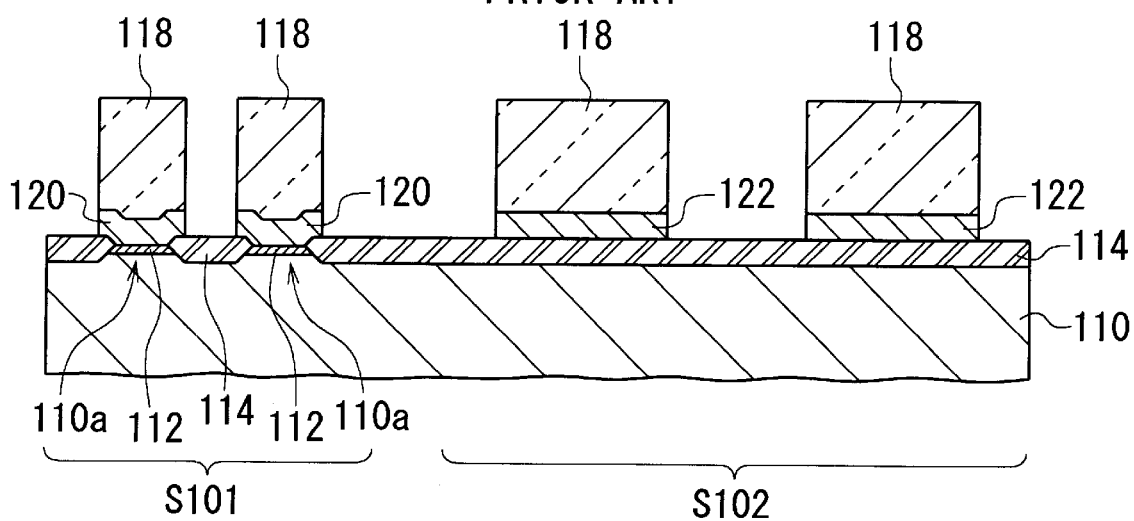

SEMICONDUCTOR MEMORY DEVICE AND METHOD OF FABRICATING THE SAME

BACKGROUND OF THE INVENTION

1. Field of the Invention

The present invention relates to a semiconductor memory device and more particularly, to a semiconductor memory device with a memory cell section including floating-gate type transistors and a capacitor section including capacitors, and a method of fabricating the device.

2. Description of the Related Art

Generally, it is important for semiconductor memory devices to increase the capacitance of capacitors and to decrease the chip area.

FIG. 1 shows schematically the layout of a prior-art semiconductor memory device, which has the memory cell section S101 and the capacitor section S102 on a semiconductor substrate.

The prior-art semiconductor memory device of FIG. 1 is fabricated in the following way.

First, as shown in FIG. 2A, a silicon dioxide ($SiO_2$) layer (not shown) with a thickness of 3 nm to 20 nm is formed on the surface of a p-type semiconductor substrate (e.g., a single-crystal silicon substrate) 110. A silicon nitride ($SiN_X$) layer (not shown) with a thickness of 100 nm to 200 nm is formed on the $SiO_2$ layer and is patterned to have a specific plan shape. Then, a $SiO_2$ layer is selectively formed on the exposed surface of the substrate 110 from the patterned $SiN_X$ layer, forming an isolation dielectric 114. The isolation dielectric 114 thus formed defines active regions 110a on the substrate 110.

Then, a first gate dielectric layer 112 with a thickness of 5 nm to 15 nm is selectively formed on the exposed surface of the substrate 110 in the active regions 110a by a thermal oxidation process.

An n-type polysilicon layer with a thickness of approximately 50 nm to 200 nm, which is doped with an appropriate dopant such as phosphorus (P), is formed over the entire substrate 110 to cover the isolation dielectric 114 and the active regions 110a. After a patterned resist film 118 is formed on the polysilicon layer, the polysilicon layer is selectively etched to form floating gates 120 on the gate dielectric layer 112 in the memory cell section S101 and lower electrodes 122 on the isolation dielectric 114 in the capacitor section S102 using the film 118 as a mask. The state at this stage is shown in FIG. 2A.

After the patterned resist film 118 is removed, a dielectric layer 124 with a thickness of approximately 10 nm to 20 nm is formed over the substrate 110 by a thermal oxidation or chemical vapor deposition (CVD) process, covering the floating gates 120 in the memory cell section S101 and the lower electrodes 122 in the capacitor section S102. The layer 124 has a three-layer structure; i.e., the layer 124 is formed by a $SiO_2$ sublayer, a $SiN_X$ sublayer, and a $SiO_2$ sublayer stacked in this order. Thus, the layer 124 is a so-called "ONO" layer. Next, an n-type polysilicon layer 126 with a thickness of approximately 100 nm to 200 nm is formed on the dielectric (ONO) layer 124 over the entire substrate 110.

After a patterned resist film 128 is formed on the polysilicon layer 126, the polysilicon layer 126 and the dielectric (ONO) layer 124 are selectively etched to define the memory cell section S101 and the capacitor section S102 on the substrate 110 using the film 128 as a mask. The state at this stage is shown in FIG. 2B.

As seen from FIG. 2B, the remaining dielectric layer 124 in the memory cell section S101 forms a second gate dielectric layer 124a and at the same time, the remaining polysilicon layer 126 in the memory cell section S101 forms control gates 130. The remaining dielectric layer 124 in the capacitor section S102 forms a capacitor dielectric layer 124b.

Subsequently, after the resist film 128 is removed, a patterned resist film 132 is formed on the polysilicon layer 126 thus patterned. Then, the polysilicon layer 126 is selectively etched to define the capacitors in the capacitor section S102 using the film 132 as a mask. The state at this stage is shown in FIG. 2C. As seen from FIG. 2C, the remaining polysilicon layer 126 in the capacitor section S102 is divided to form upper electrodes 134.

Thereafter, the patterned resist film 132 is removed, resulting in the structure shown in FIG. 2D. Specifically, in the memory cell section S101, the first gate dielectric layer 112, the floating gate 120, the second gate dielectric layer 124a, and the control gate 130 in each of the active regions 110a constitute a floating-gate type transistor. In the capacitor section S102, the lower electrode 122, the common capacitor dielectric 124b, and the upper electrode 134 constitute a capacitor.

As explained above, with the prior-art semiconductor memory device, each of the capacitors is located on the isolation dielectric 114 and is formed by the lower electrode 122, the common capacitor dielectric 124b, and the upper electrode 134. It is unlike the former, typical capacitor structure that is formed by a diffusion region in the substrate 110, a gate dielectric layer, and a gate electrode. This is to suppress the parasitic capacitance existing in the capacitor section S102.

In recent years, the capacitor structure of the prior-art semiconductor memory device of FIG. 1 tends to be insufficient to meet the need of further decreasing the chip area. To meet this need, an improvement has been created and disclosed, in which recesses are uniformly formed on the surfaces of the lower electrodes 122 in the capacitor section S102. This is to expand the surface area of each lower electrode 122, thereby increasing the capacitance. Therefore, in this improvement, the chip area can be reduced without decreasing the capacitance of each capacitor.

However, in the improvement, there arises a problem about the withstand voltage. Specifically, since the lower electrode 122 has the recesses on its surface, the capacitor dielectric 124b extends along the recesses, resulting in a problem of degradation of the withstand voltage of the dielectric 124b. To ensure satisfactory withstand voltage, the dielectric 124b needs to be thicker, which means that the second gate dielectric layer 124a of each transistor in the memory cell area S101 needs to be thicker as well. This is because the capacitor dielectric layer 124b and the second gate dielectric layer 124a are formed by the same dielectric layer 124. As a result, there arises a problem that the performance or characteristic of the transistors in the memory cell section S101 deteriorates.

As explained above, when the above-described improvement is adopted to increase the capacitance, the withstand voltage of the capacitor dielectric 124b in the capacitor section S102 degrades. When the capacitor dielectric 124b is formed thicker to ensure its sufficient withstand voltage, the performance or characteristic of the transistors in the memory cell section S101 deteriorates.

SUMMARY OF THE INVENTION

Accordingly, an object of the present invention is to provide a semiconductor memory device that makes it possible to increase the capacitance of capacitors in the capacitor section without degrading the withstand voltage of the capacitor dielectric, and a method of fabricating the device.

Another object of the present invention is to provide a semiconductor memory device that makes it possible to increase the capacitance of capacitors in the capacitor section without degrading the performance of characteristic of the memory cell section, and a method of fabricating the device.

The above objects together with others not specifically mentioned will become clear to those skilled in the art from the following description.

According to a first aspect of the present invention, a semiconductor memory device is provided. This device comprises:

(a) a semiconductor substrate with an isolation dielectric;
the isolation dielectric defining active regions on the substrate;

(b) a memory cell section formed on the substrate;
the memory cell section including floating-gate type transistors formed in the active regions;
each of the transistors having a first gate dielectric, a floating gate formed on the first gate dielectric, a second gate dielectric formed on the floating gate, and a control gate formed on the second gate dielectric; and (c) a capacitor section formed on the substrate;
the capacitor section including capacitors formed on the isolation dielectric of the substrate;
each of the capacitors having a lower electrode formed on the isolation dielectric, a capacitor dielectric formed on the lower electrode, and an upper electrode formed on the capacitor dielectric;
a first part of the capacitors being designed to be applied with a first voltage and a second part of the capacitors being applied with a second voltage on operation, where the first voltage is lower than the second voltage;
each of the first part of the capacitors having a recess formed on the lower electrode, thereby increasing its capacitance.

With the semiconductor memory device according to the first aspect of the present invention, each of the first part of the capacitors has the recess formed on the lower electrode, thereby increasing its capacitance. Due to the formation of the recess, the withstand voltage of the capacitor dielectric of the first part of the capacitors degrades. However, the first part of the capacitors is/are designed to be applied with the first voltage lower than the second voltage. As a result, the formation of the recess will not cause any disadvantage relating to the withstand voltage.

On the other hand, each of the second part of the capacitors, which are designed to be applied with the second voltage higher than the first voltage, has no recess. Therefore, the withstand voltage of the capacitor dielectric is prevented from degrading.

Accordingly, the capacitance of the capacitors can be increased without degrading the withstand voltage and without increasing the chip area.

In a preferred embodiment of the semiconductor memory device according to the first aspect, the recess of the lower electrode of each of the first part of the capacitors is less than a thickness of the lower electrode. In this embodiment, there is an additional advantage that the obtainable capacitance is further increased because the part of the lower electrode at the bottom of the recess contributes the capacitance generation of each of the first part of the capacitors.

In another preferred embodiment of the semiconductor memory device according to the first aspect, the upper electrode of each of the first or second part of the capacitors is narrower than the lower electrode thereof. In this embodiment, there is an additional advantage that the capacitor dielectric (and the second gate dielectric of each of the transistors in the memory cell section) can be formed thinner. This is because the part of the capacitor dielectric on the side face of the lower electrode which tends to be thinner than that on the upper surface thereof, is not used and therefore, the withstand voltage of the capacitor does not degrade.

In still another preferred embodiment of the semiconductor memory device according to the first aspect, the upper electrode of each of the second part of the capacitors is narrower than the lower electrode thereof while the upper electrode of each of the first part of the capacitors is not narrower than the lower electrode thereof. In this embodiment, there is an additional advantage that the capacitor dielectric (and the second gate dielectric of each of the transistors in the memory cell section) can be formed thinner while the capacitance is increased.

According to a second aspect of the present invention, a method of fabricating a semiconductor memory device is provided, where the device includes a memory cell section including floating-gate type transistors and a capacitor section including capacitors. This method comprises the steps of:

(a) forming an isolation dielectric on a semiconductor substrate;
the isolation dielectric defining active regions on the substrate;

(b) selectively forming a first dielectric layer on the active regions of the substrate;

(c) forming a first conductive layer on the first dielectric layer and the isolation dielectric;

(d) patterning the first conductive layer to form floating gates of the floating-gate type transistors on the first dielectric layer in the memory cell section and lower electrodes of the capacitors on the isolation dielectric in the capacitor section;
a first part of the capacitors being designed to be applied with a first voltage and a second part of the capacitors being applied with a second voltage on operation, where the first voltage is lower than the second voltage;

(e) forming a recess on each of the lower electrodes of the first part of the capacitors;

(f) forming a second dielectric layer to cover the floating gates of the transistors and the lower electrodes of the capacitors;

(g) forming a second conductive layer on the second dielectric layer; and (h) pattering the second conductive layer and the second dielectric layer to form control gates of the transistors and upper electrodes of the capacitors;
wherein each of the transistors is constituted by the first gate dielectric, the floating gate formed on the first gate dielectric, the second gate dielectric formed on the floating gate, and the control gate formed on the second gate dielectric;
and wherein each of the capacitors is constituted by the lower electrode, the capacitor dielectric formed on the lower electrode, and the upper electrode formed on the capacitor dielectric.

With the method according to the second aspect of the present invention, the semiconductor memory device having a memory cell section including floating-gate type transistors and the capacitor section including capacitors according to the first aspect is fabricated.

In a preferred embodiment of the method according to the second aspect, the recess of the lower electrode of reach of the first part of the capacitors is set to be less than a thickness of the lower electrode in the step (e). In this embodiment, there is an additional advantage that the obtainable capacitance is further increased because the part of the lower electrode at the bottom of the recess contributes the capacitance generation of each of the first part of the capacitors.

In another preferred embodiment of the method according to the second aspect, the upper electrode of each of the first or second part of the capacitors is set to be narrower than the lower electrode thereof. In this embodiment, there is an additional advantage that the capacitor dielectric (and the second gate dielectric of each of the transistors in the memory cell section) can be formed thinner. This is because the part of the capacitor dielectric on the side face of the lower electrode, which tends to be thinner than that on the upper surface thereof, is not used and therefore, the withstand voltage of the capacitor does not degrade.

In still another preferred embodiment of the method according to the second aspect, the upper electrode of each of the second part of the capacitors is set to be narrower than the lower electrode thereof while the upper electrode of each of the first part of the capacitors is not set to be narrower than the lower electrode thereof. In this embodiment, there is an additional advantage that the capacitor dielectric (and the second gate dielectric of each of the transistors in the memory cell section) can be formed thinner. This is because the part of the capacitor dielectric on the side face of the lower electrode, which tends to be thinner than that on the upper surface thereof, is not used in the second part of the capacitors to which the second voltage higher than the first voltage is applied.

BRIEF DESCRIPTION OF THE DRAWINGS

In order that the present invention may be readily carried into effect, it will now be described with reference to the accompanying drawings.

FIG. 1 is a schematic plan view showing the layout of the memory cell section and the capacitor section on a semiconductor substrate in a prior-art semiconductor memory device.

FIGS. 2A to 2D are schematic cross-sectional views along the line II—II in FIG. 1, which show a method of fabricating the prior-art semiconductor device of FIG. 1, respectively.

DETAILED DESCRIPTION OF THE PREFERRED EMBODIMENTS

Figure 2B:
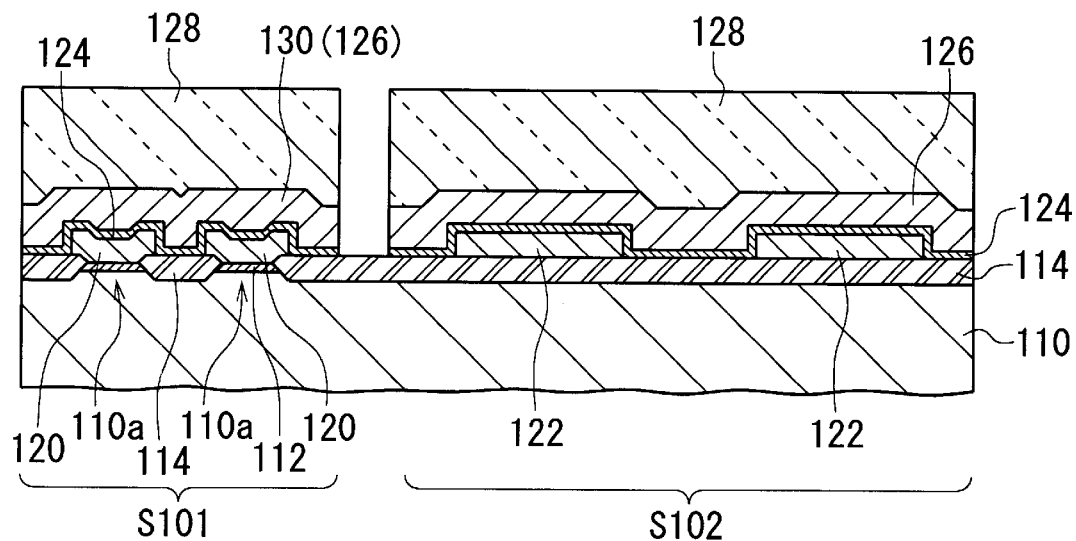
Figure 2C:
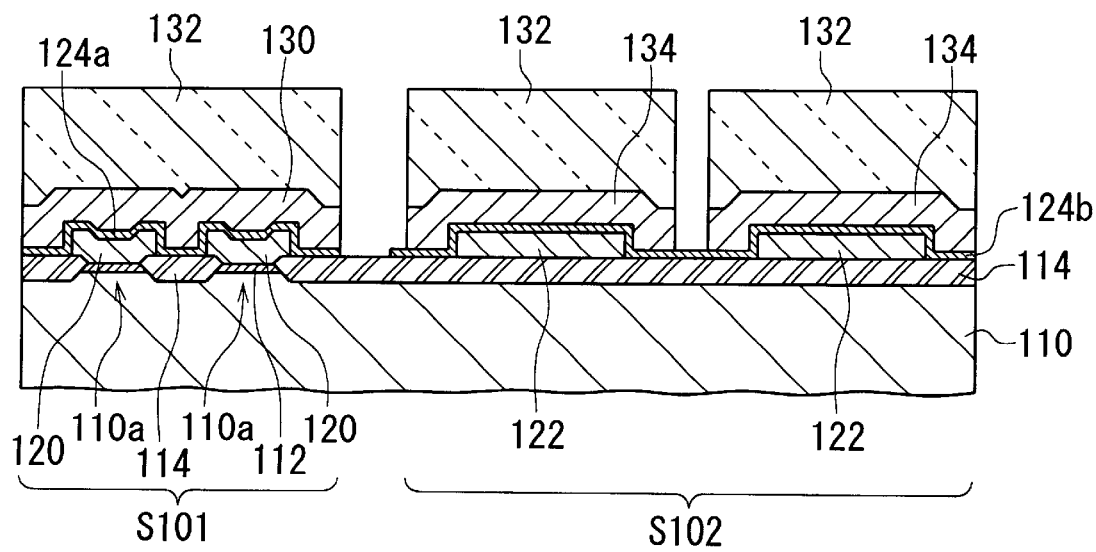
Figure 2D:
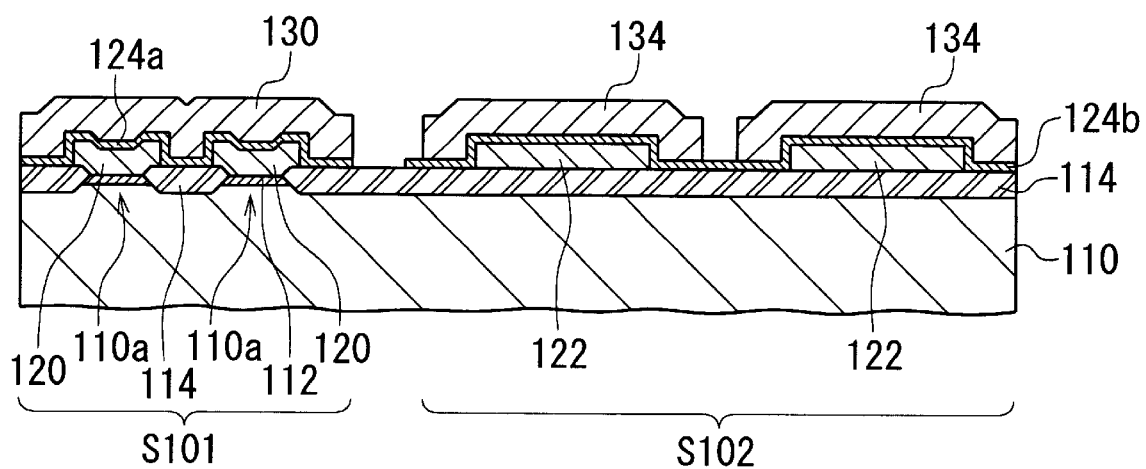

Preferred embodiments of the present invention will be described in detail below while referring to the drawings attached.

FIRST EMBODIMENT

Figure 3:
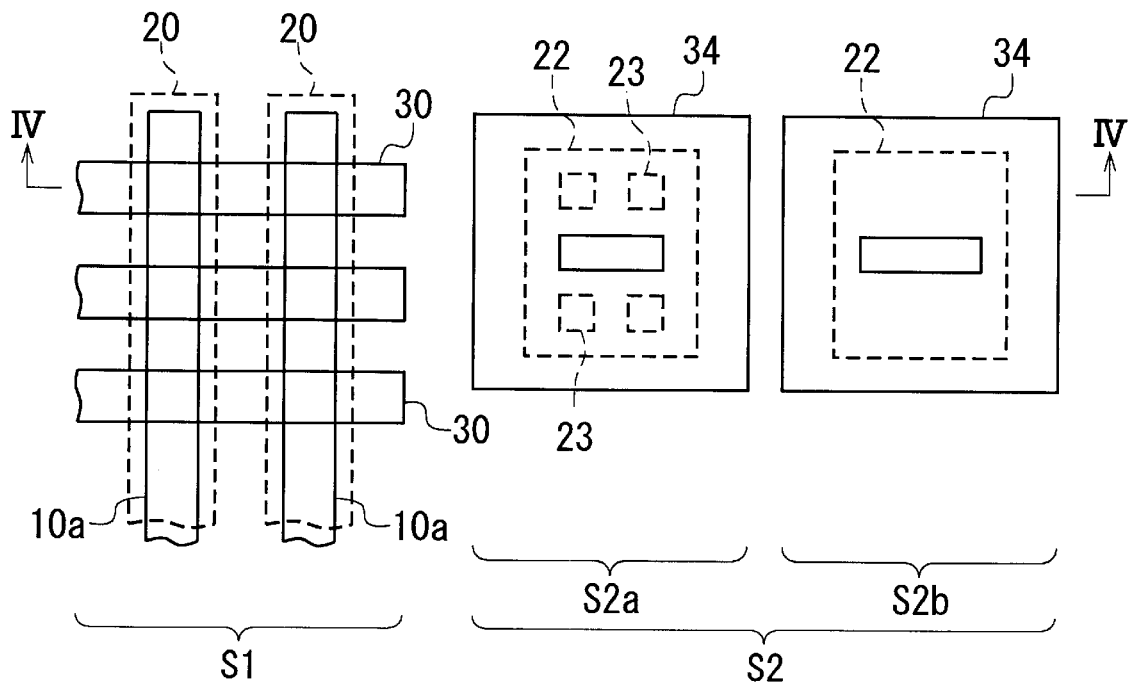
FIG. 3 is a schematic plan view showing the layout of the memory cell section and the capacitor section on a semiconductor substrate in a semiconductor memory device according to a first embodiment of the invention.
Figure 4A:
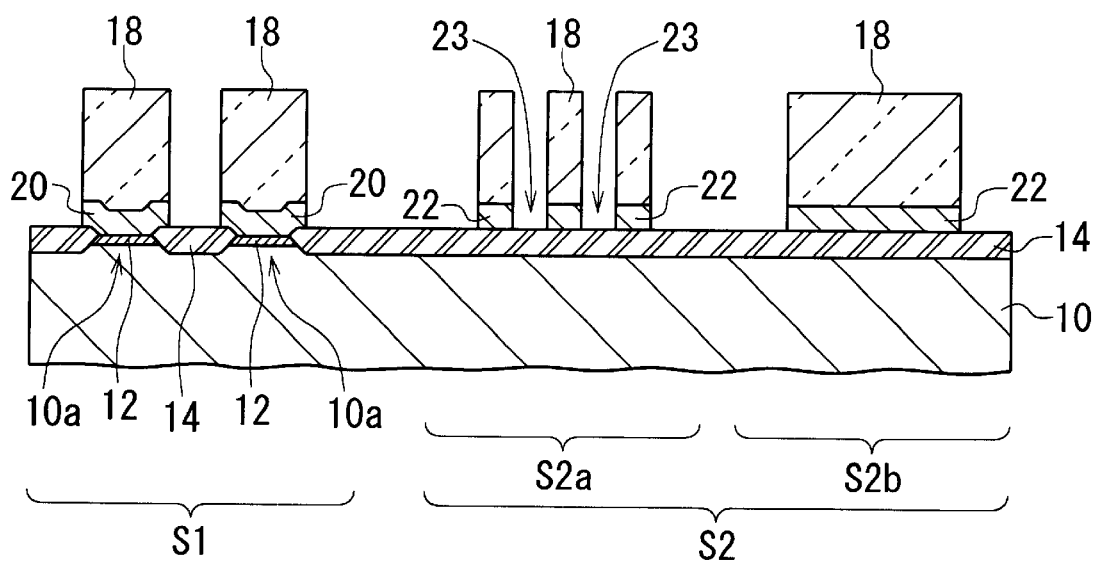
FIGS. 4A to 4D are schematic cross-sectional views along the line IV—IV in FIG. 3, which show a method of fabricating the semiconductor device according to the first embodiment of the invention, respectively.
Figure 4B:
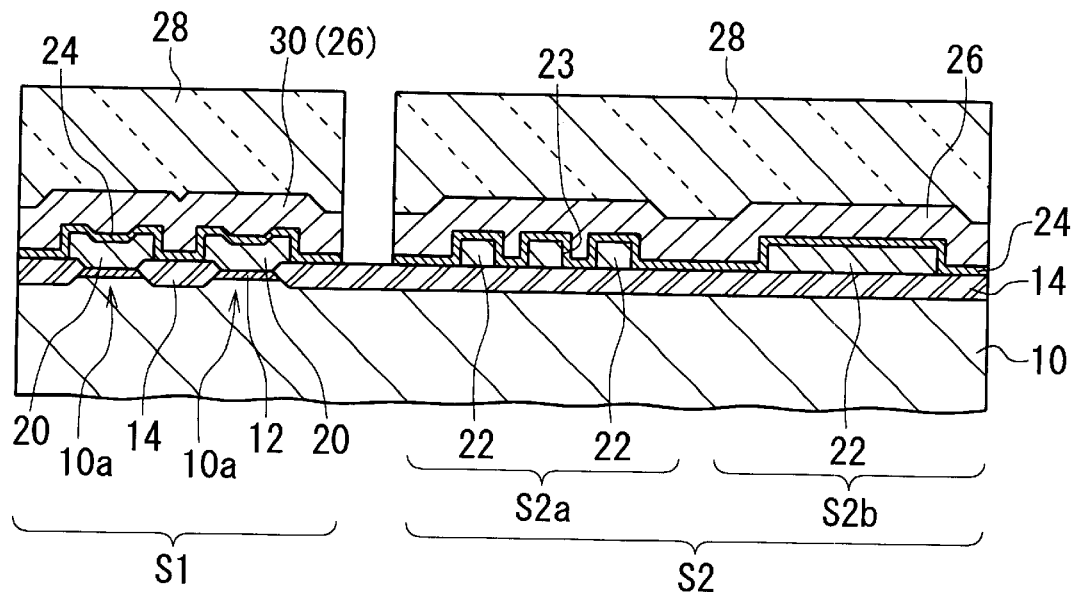
Figure 4C:
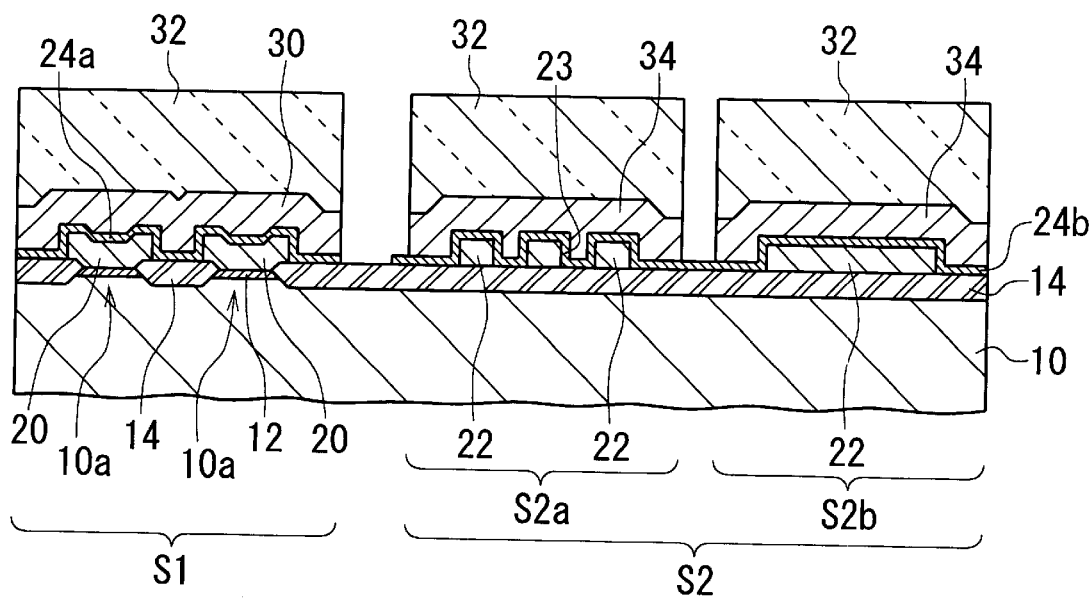
Figure 4D:
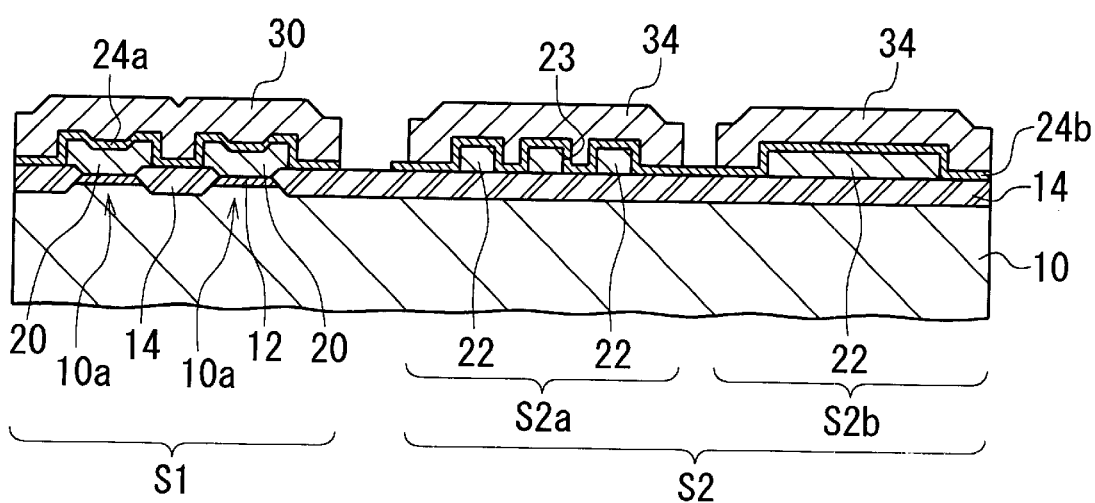

FIGS. 3 and 4D show schematically the configuration of a semiconductor memory device according to a first embodiment of the invention, which has the memory cell section S1 and the capacitor section S2 on a semiconductor substrate. Floating-gate type transistors, which constitute memory cells, are arranged in the memory cell section S1. Capacitors are arranged in the capacitor section S2, in which the section S2 is divided into the first subsection S2$a$ and the second subsection S2$b$.

The capacitors in the first subsection S2$a$ are designed to be applied with a first voltage. The capacitors in the second subsections S2$b$ are designed to be applied with a second voltage higher than the first voltage. One of the capacitors in the subsections S2$a$ and one of the capacitors in the subsection S2$b$ are shown in FIG. 3 for simplification of description.

The semiconductor memory device according to the first embodiment of FIGS. 3 and 4D is fabricated in the following way.

First, as shown in FIG. 4A, a SiO$_2$ layer (not shown) with a thickness of 3 nm to 20 nm is formed on the surface of a p-type semiconductor substrate (e.g., a single-crystal silicon substrate) 10. A SiN$_X$ layer (not shown) with a thickness of 100 nm to 200 nm is formed on the SiO$_2$ layer and is patterned to have a specific plan shape. Then, a SiO$_2$ layer is selectively formed on the exposed surface of the substrate 10 from the patterned SiN$_X$ layer, forming an isolation dielectric 14. The isolation dielectric 14 thus formed defines active regions 10$a$ on the substrate 10.

Then, a first gate dielectric layer 12 with a thickness of 5 nm to 15 nm is selectively formed on the exposed surface of the substrate 10 in the active regions 10$a$ by a thermal oxidation process.

An n-type polysilicon layer with a thickness of approximately 50 nm to 200 nm, which is doped with an appropriate dopant such as phosphorus (P), is formed over the entire substrate 10 to cover the isolation dielectric 14 and the active regions 10$a$. After a patterned resist film 18 is formed on the polysilicon layer, the polysilicon layer is selectively etched to form floating gates 20 on the gate dielectric layer 12 in the memory cell section S1 and lower electrodes 22 on the isolation dielectric 14 in the capacitor section S2 using the film 18 as a mask. In this etching process, recesses 23 are formed in the lower electrodes 22 of the capacitors in the first subsection S2$a$ to be applied with the relatively lower first voltage. The depth of the recesses 23 is equal to the thickness of the lower electrodes 22. No recesses are formed in the lower electrodes 22 of the capacitors in the second subsection S2$b$ to be applied with the relatively higher second voltage. The state at this stage is shown in FIG. 4A.

The above-described process steps are the same as those in the method of fabricating the prior-art semiconductor memory device shown in FIGS. 2A to 2D except for the recesses 23 are formed in the lower electrodes 22.

After the patterned resist film 18 is removed, a dielectric layer 24 with a thickness of approximately 10 nm to 20 nm is formed over the substrate 10 by a thermal oxidation or CVD process, covering the floating gates 20 in the memory cell section S1 and the lower electrodes 22 in the capacitor section S2. The layer 24 has a three-layer structure; i.e., the layer 124 is formed by a SiO$_2$ sublayer, a SiN$_x$ sublayer, and a SiO$_2$ sublayer stacked in this order. Thus, the layer 24 is a so-called "ONO" layer. Next, an n-type polysilicon layer 26 with a thickness of approximately 100 nm to 200 nm is formed on the dielectric (ONO) layer 24 over the entire substrate 10.

After a patterned resist film 28 is formed on the polysilicon layer 26, the polysilicon layer 26 and the dielectric (ONO) layer 24 are selectively etched to define the memory cell section S1 and the capacitor section S2 on the substrate 10 using the film 28 as a mask. The state at this stage is shown in FIG. 4B.

As seen from FIG. 4B, the remaining dielectric layer 24 in the memory cell sections S1 forms a second gate dielectric layer 24a and at the same time, the remaining polysilicon layer 26 in the memory cell section S1 forms control gates 30. The remaining dielectric layer 24 in the capacitor section S2 forms a capacitor dielectric layer 24b.

Subsequently, after the patterned resist film 28 is removed, a patterned resist film 32 is formed on the polysilicon layer 26 thus patterned. Then, the polysilicon layer 26 is selectively etched to define the capacitors in the capacitor section S2 using the film 32 as a mask. The state at this stage is shown in FIG. 4C. As seen from FIG. 4C, the remaining polysilicon layer 26 in the capacitor section S2 is divided to form upper electrodes 34.

Thereafter, the patterned resist film 32 is removed, resulting in the structure shown in FIG. 4D. Specifically, in the memory cell section S1, the first gate dielectric layer 12, the floating gate 20, the second gate dielectric layer 24a, and the control gate 30 in each of the active regions 10a constitute the floating-gate type transistor. In the capacitor section S2, the lower electrode 22, the common capacitor dielectric 24b, and the upper electrode 34 constitute the capacitor.

As explained above, with the semiconductor memory device according to the first embodiment, each of the capacitors in the first subsection S2a has the recesses 23 formed on the lower electrode 22, thereby increasing its capacitance. Due to the formation of the recesses 23, the withstand voltage of the capacitor dielectric 24b of the capacitors in the first subsection S2a lowers compared with the case of no recesses being formed. However, the capacitors in the first subsection S2a are designed to be applied with the first voltage lower than the second voltage. As a result, the formation of the recesses 23 will not cause any disadvantage relating to the withstand voltage.

On the other hand, each of the capacitors in the second subsection S2b, which are designed to be applied with the second voltage higher than the first voltage, has no recess. Therefore, the withstand voltage of the capacitor dielectric 24b is prevented from degrading in the subsection S2b.

Accordingly, the capacitance of the capacitors can be increased without degrading the withstand voltage and without increasing the chip area. In other words, the chip area of the capacitor section S2 is reduced.

Moreover, with the fabrication method according to the first embodiment, the recesses 23 are additionally formed in the etching process of selectively etching the lower electrodes 22 in the first subsection S2a of the capacitor sections S2. Thus, no additional process step needs to be added to the prior-art fabrication method shown in FIGS. 2A to 2D. This means that the method can be carried out comparatively easily with existing fabrication facilities at a low cost.

SECOND EMBODIMENT

Figure 5:
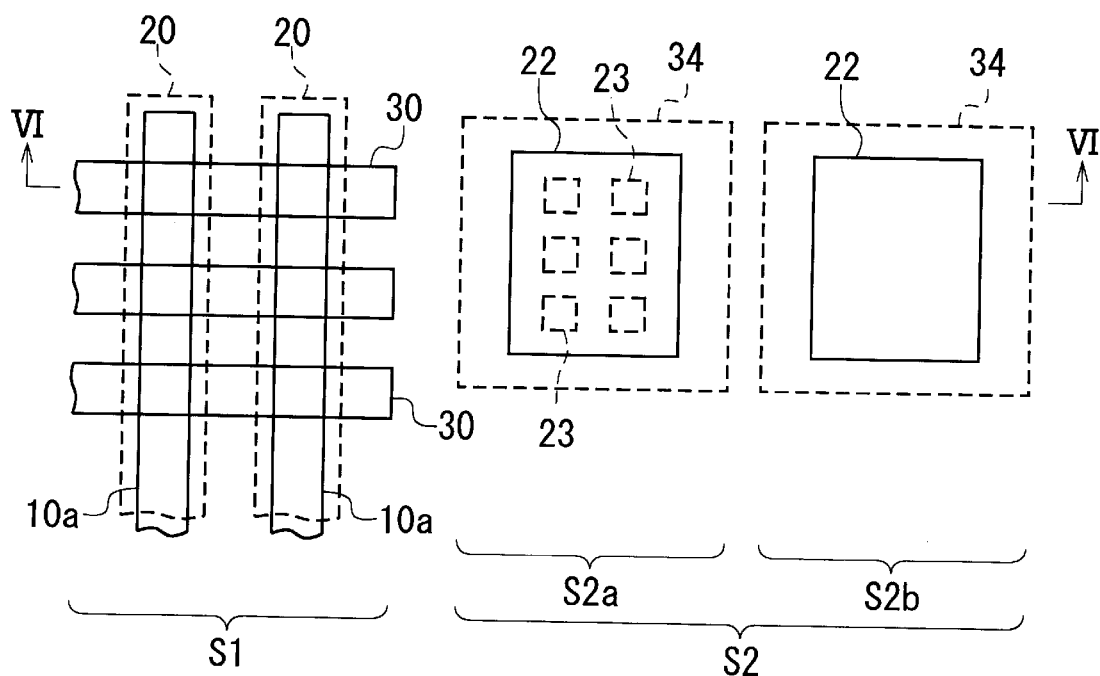
FIG. 5 is a schematic plan view showing the layout of the memory cell section and the capacitor section on a semiconductor substrate in a semiconductor memory device according to a second embodiment of the invention.
Figure 6A:
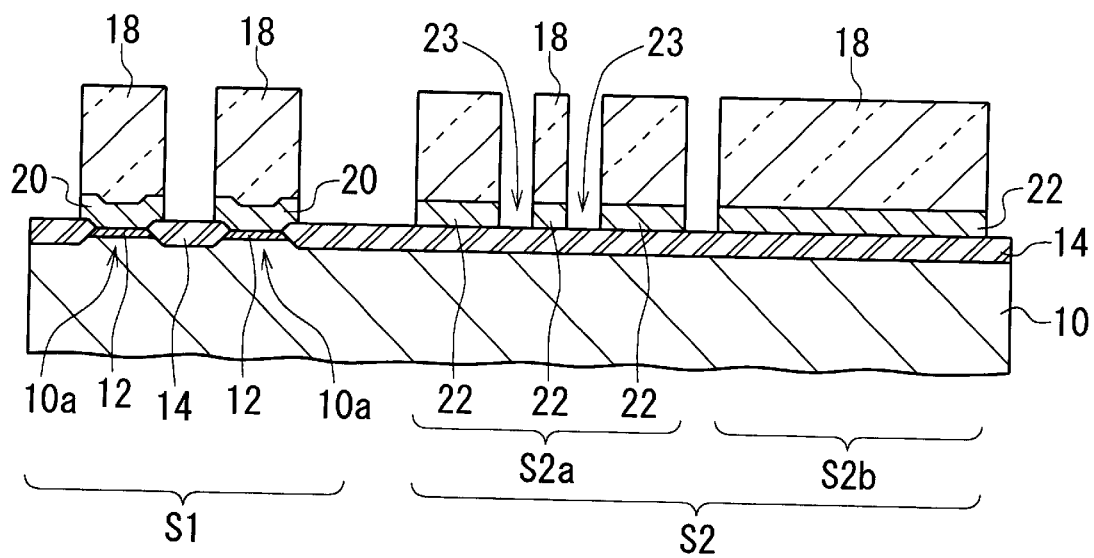
FIGS. 6A to 6D are schematic cross-sectional views along the line VI—VI in FIG. 5, which show a method of fabricating the semiconductor device according to the second embodiment of the invention, respectively.
Figure 6B:
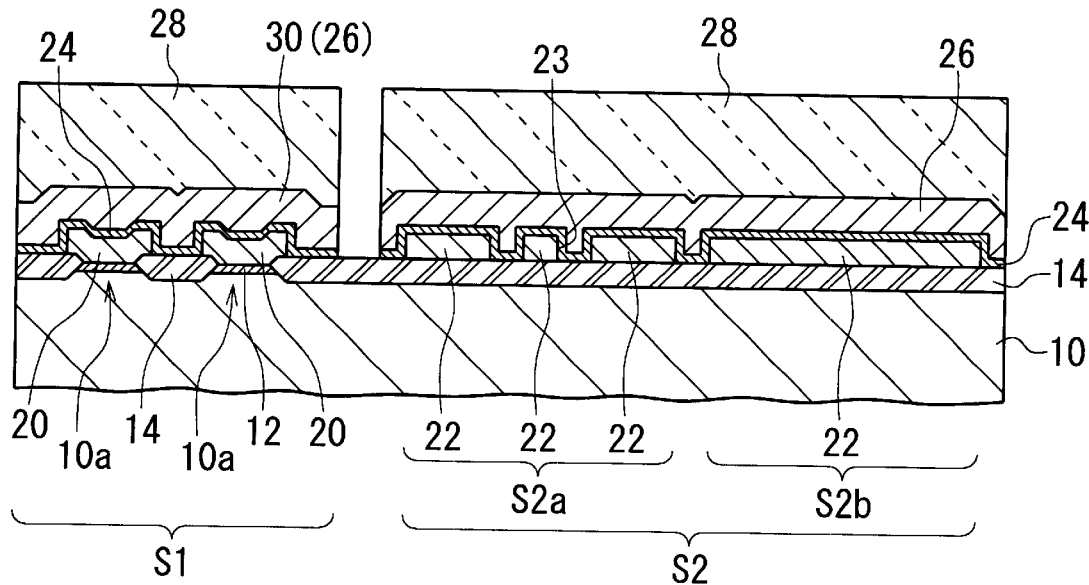
Figure 6C:
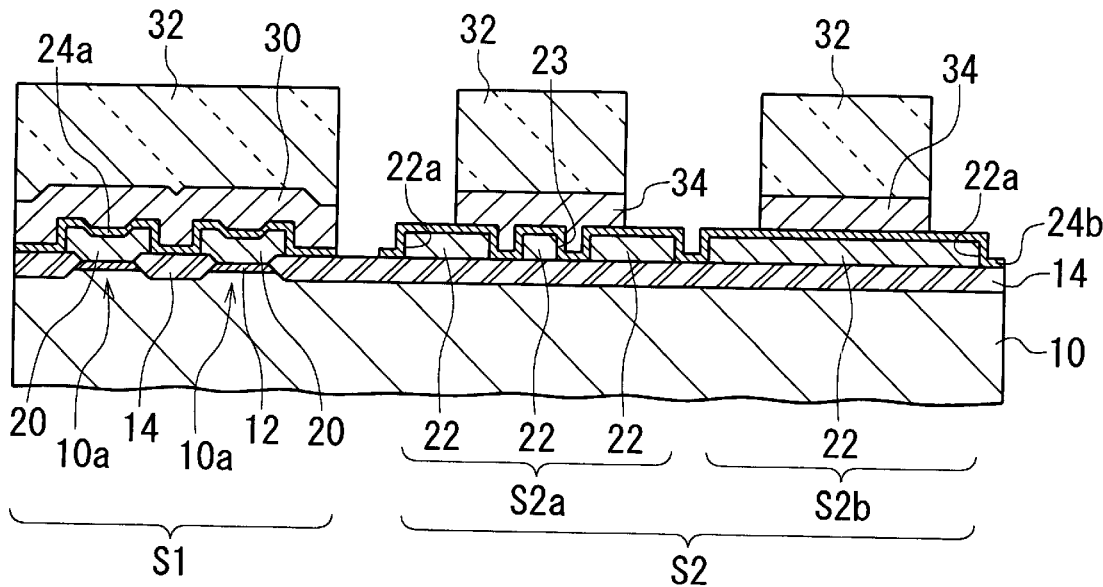
Figure 6D:
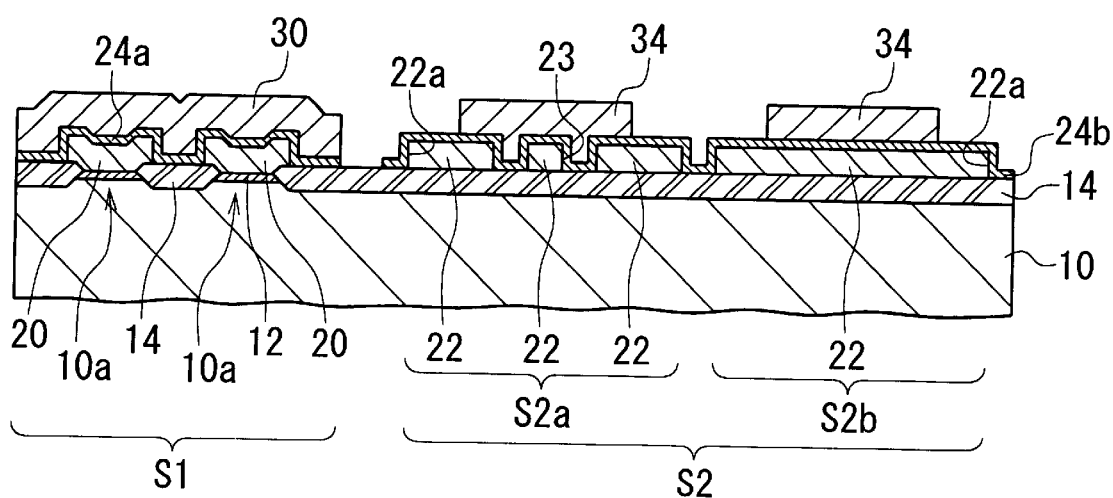

FIGS. 5 and 6D show schematically the configuration of a semiconductor memory device according to a second embodiment of the invention. This device has the same configuration as the device according to the first embodiment except that the size of the upper electrodes 34 is smaller than the lower electrodes 22 for the capacitors in both the first and second subsections S2a and S2b of the capacitor sections S2. Therefore, the explanation about the same configuration as the first embodiment is omitted here for simplification of description.

The semiconductor memory device according to the second embodiment of FIGS. 5 and 6D is fabricated in the following way.

First, as shown in FIG. 6A, in the same way as the first embodiment, the isolation dielectric 14 for defining the active regions 10a is formed on the surface of the substrate 10. Then, the first gate dielectric layer 12 is selectively formed on the exposed surface of the substrate 10 in the active regions 10a. An n-type polysilicon layer with a thickness of approximately 50 nm to 200 nm is formed over the entire substrate 10 to cover the isolation dielectric 14 and the active regions 10a. After a patterned resist film 18 is formed on the polysilicon layer, the polysilicon layer is selectively etched to form floating gates 20 on the gate dielectric layer 12 in the memory cell section S1 and lower electrodes 22 on the isolation dielectric 14 in the capacitor section S2 using the film 18 as a mask.

In this etching process, the recesses 23 are formed in the lower electrodes 22 of the capacitors in the first subsection S2a to be applied with the relatively lower first voltage. No recesses are formed in the lower electrodes 22 of the capacitors in the second subsection S2b to be applied with the relatively higher second voltage. The state at this stage is shown in FIG. 6A.

The above-described process steps are the same as those in the method of fabricating the semiconductor memory device of the first embodiment as shown in FIGS. 4A to 4D except that the lower electrodes 22 are formed to be larger than the first embodiment.

After the patterned resist film 18 is removed, a dielectric layer 24 with a thickness of approximately 10 nm to 20 nm is formed over the substrate 10 by a thermal oxidation or CVD process, covering the floating gates 20 in the memory cell section S1 and the lower electrodes 22 in the capacitor section S2. Next, an n-type polysilicon layer 26 with a thickness of approximately 100 nm to 200 nm is formed on the dielectric (ONO) layer 24 over the entire substrate 10.

After a patterned resist film 28 is formed on the polysilicon layer 26, the polysilicon layer 26 and the dielectric (ONO) layer 24 are selectively etched to define the memory cell section S1 and the capacitor section S2 on the substrate 10 using the film 28 as a mask. The state at this stage is shown in FIG. 6B.

As seen from FIG. 6B, the remaining dielectric layer 24 in the memory cell section S1 forms a second gate dielectric layer 24a and at the same time, the remaining polysilicon layer 26 in the memory cell section S1 forms control gates 30. The remaining dielectric layer 24 in the capacitor section S2 forms a capacitor dielectric layer 24b.

Subsequently, after a patterned resist film 28 is removed, a patterned resist film 32 is formed on the polysilicon layer 26 thus patterned. Then, the polysilicon layer 26 is selectively etched to define the capacitors in the capacitor section S2 using the film 32 as a mask. The state at this stage is shown in FIG. 6C. As seen from FIG. 6C, the remaining polysilicon layer 26 in the capacitor section S2 is divided to form upper electrodes 34.

Unlike the first embodiment, as seen from FIG. 6C, the upper electrodes 34 are considerably narrower than the lower electrodes 22, which are narrower than the first embodiment. Thus, the upper electrodes 34 are not overlapped with the side faces 22a of the lower electrodes 22. In other words, the parts of the capacitor dielectric 24b opposing to the side faces 22a of the lower electrodes 22 do not provide the capacitor function. This means that the withstand voltage of the capacitor dielectric 24b can be improved or raised without increasing the thickness of the dielectric 24b. This is because the parts of the capacitor dielectric 24b opposing to the side faces 22a of the lower electrodes 22 tend to be thinner than the parts on the horizontal, upper surfaces of the lower electrodes 22.

Thereafter, the patterned resist film 32 is removed, resulting in the structure shown in FIG. 6D. Specifically, in the memory cell section S1, the first gate dielectric layer 12, the floating gate 20, the second gate dielectric layer 24a, and the control gate 30 in each of the active regions 10a constitute the floating-gate type transistor. In the capacitor section S2, the lower electrode 22, the common capacitor dielectric 24b, and the upper electrode 34 constitute the capacitor.

As explained above, with the semiconductor memory device according to the second embodiment, in addition to the same advantages as those in the first embodiment, there is an additional advantage that the withstand voltage of the capacitor dielectric 24b is improved or raised without increasing the thickness of the dielectric 24b (i.e., without degrading the performance of the transistors or memory cells in the memory cell section S1).

There is another additional advantage that the no additional process step needs to be added to the prior-art fabrication method shown in FIGS. 2A to 2D by simply adjusting the area of the upper electrodes 34.

In a variation of the second embodiment, the size of the upper electrodes 34 of the capacitors in only the second subsection S2b of the capacitor section S2, which are applied with the second voltage higher than the first voltage, is smaller than the lower electrodes 22 for the capacitors. In this case, the upper electrodes 34 of the capacitors in the first subsection S2a of the capacitor section S2, which are applied with the first voltage, has the same configuration as that of the first embodiment of FIG. 4D. There is an additional advantage that the capacitance of the capacitors in the subsection S2a is increased. This is because the side faces 22a are used for capacitor function. In other words, the chip area of the capacitor section S2 is decreased.

THIRD EMBODIMENT

In the methods of the above-explained first and second embodiments, the formation of the floating gates 20 in the memory cell section S1 and the formation of the lower electrodes 22 in the capacitor section S2 are carried out in the same process step. Therefore, it is difficult to leave the conductive material for the floating gates 20 (and the lower electrodes 22) in the recesses 23. Taking this fact into consideration, the formation of the floating gates 20 and the formation of the lower electrodes 22 are carried out in different process steps in the method of the third embodiment. As a result, capacitor function is generated at the bottoms of the recesses 23 of the lower electrodes 22 and thus, there is an additional advantage that the obtainable capacitance of the capacitors is further increased; in other words, the chip area is decreased.

Figure 7:
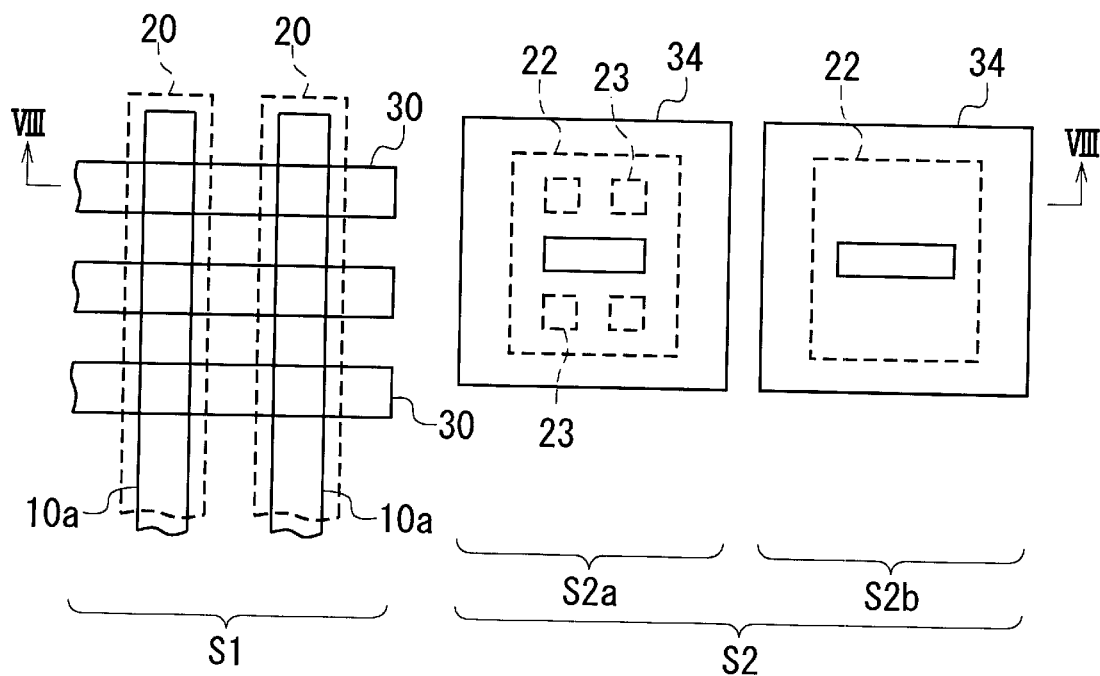
FIG. 7 is a schematic plan view showing the layout of the memory cell section and the capacitor section on a semiconductor substrate in a semiconductor memory device according to a third embodiment of the invention.
Figure 8A:
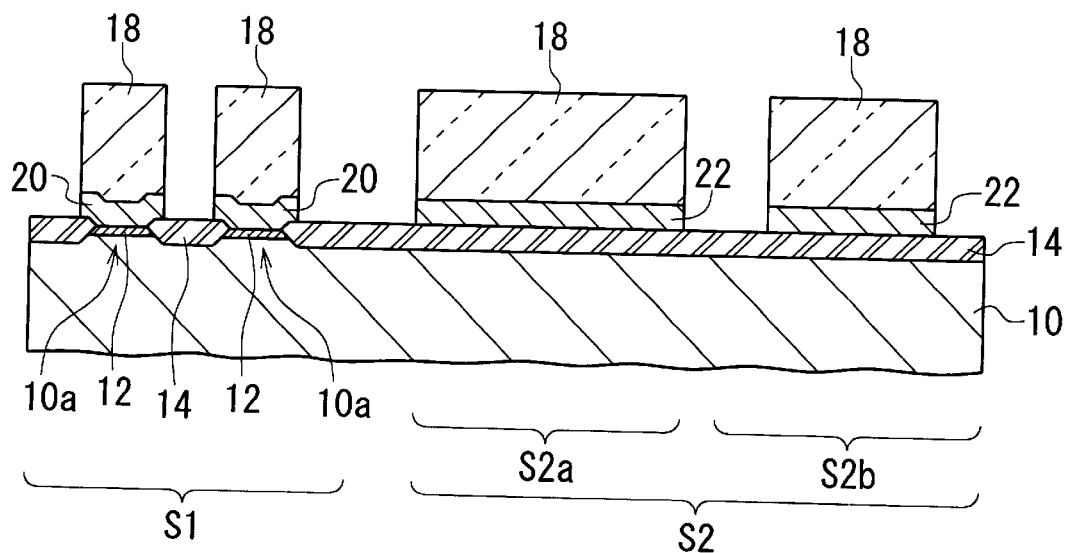
FIGS. 8A to 8D are schematic cross-sectional views along the line VIII—VIII in FIG. 7, which show a method of fabricating the semiconductor device according to the third embodiment of the invention, respectively.
Figure 8B:
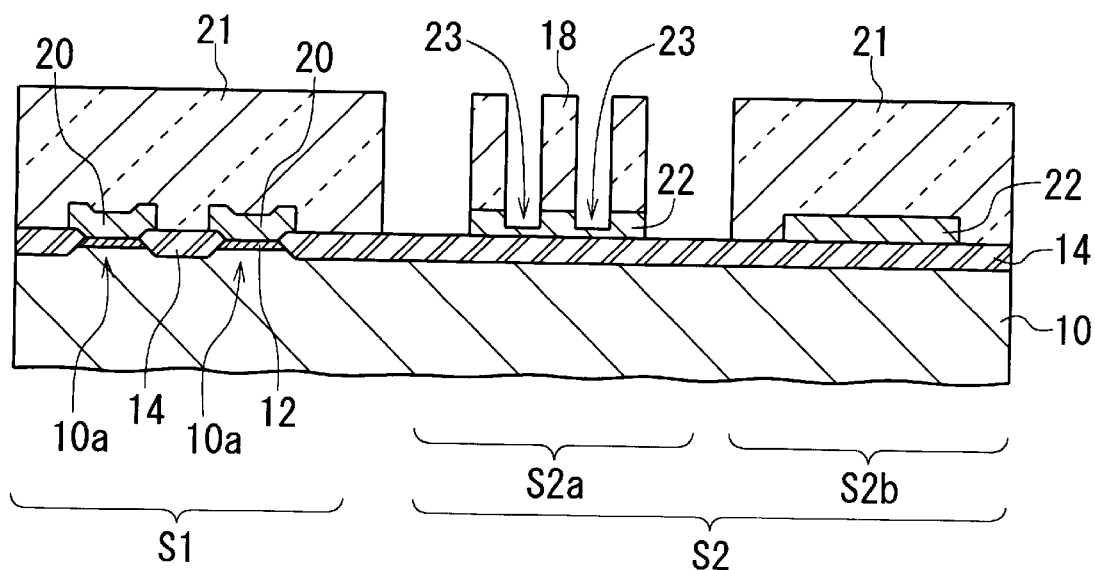
Figure 8C:
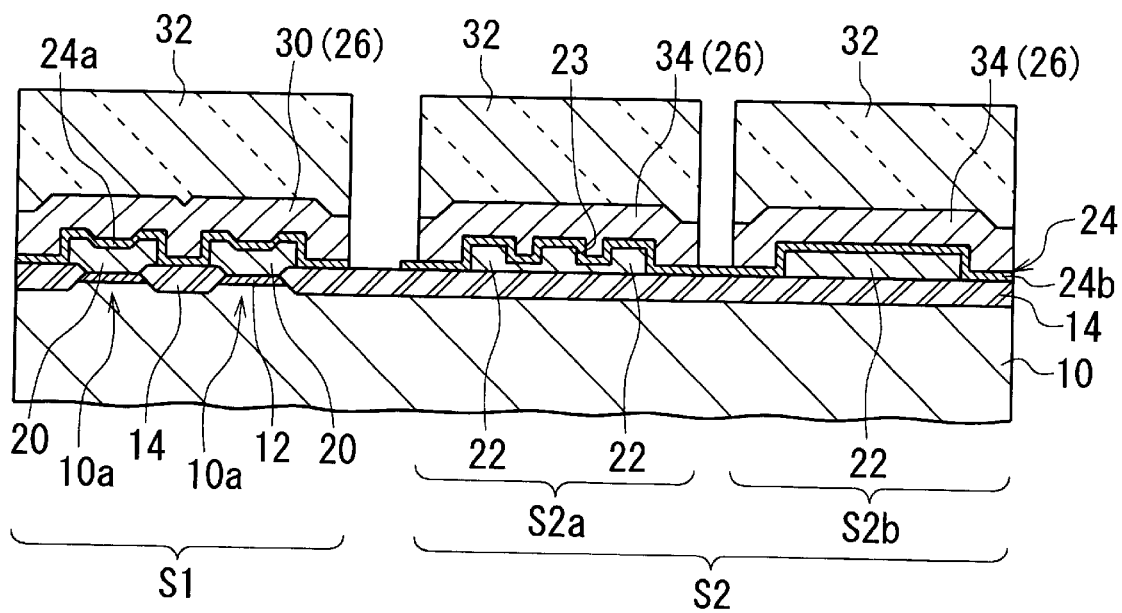
Figure 8D:
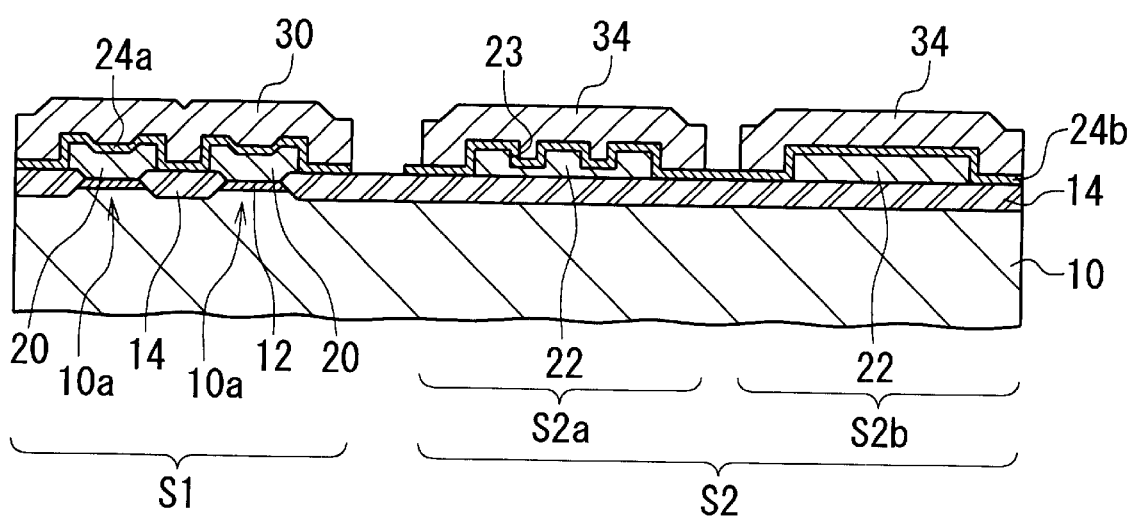

FIGS. 7 and 8D show schematically the configuration of a semiconductor memory device according to the third embodiment of the invention. This device has the same configuration as the device according to the first embodiment except that the depth of the recesses 23 of the lower electrodes 22 is smaller than the thickness of the lower electrodes 22. Therefore, the explanation about the same configuration as the first embodiment is omitted here for simplification of description.

The semiconductor memory device according to the third embodiment of FIGS. 7 and 8D is fabricated in the following way.

First, as shown in FIG. 8A, in the same way as the first embodiment, the isolation dielectric 14 for defining the active regions 10a is formed on the surface of the substrate 10. Then, the first gate dielectric layer 12 is selectively formed on the exposed surface of the substrate 10 in the active regions 10a. An n-type polysilicon layer with a thickness of approximately 50 nm to 200 nm is formed over the entire substrate 10 to cover the isolation dielectric 14 and the active regions 10a. After a patterned resist film 18 is formed on the polysilicon layer, the polysilicon layer is selectively etched to form floating gates 20 on the gate dielectric layer 12 in the memory cell section S1 and lower electrodes 22 on the isolation dielectric 14 in the capacitor section S2 using the film 18 as a mask.

In this etching process, unlike the method of the first embodiment, the recesses 23 are not formed in the lower electrodes 22 of the capacitors in the first subsection S2a to be applied with the relatively lower first voltage. The state at this stage is shown in FIG. 8A.

After the patterned resist film 18 is removed, a patterned resist film 21 is formed on the substrate 10 to cover the floating electrodes 20 and the lower electrodes 22. Using the film 21 as a mask, the lower electrodes 23 are selectively etched, forming the recesses 23 in the lower electrodes 22 of the capacitors only in the first subsection S2a to be applied with the relatively lower first voltage. No recesses are formed in the lower electrodes 22 of the capacitors in the second subsection S2b to be applied with the relatively higher second voltage. The state at this stage is shown in FIG. 8B. At this time, the conductive material for the floating gates 20 and the lower electrodes 22 (i.e., the n-type polysilicon film) is left at the bottoms of the recesses 23. The thickness of the remaining polysilicon film in the recesses 23 is set as 30 nm to 100 nm.

After the patterned resist film 21 is removed, a dielectric (ONO) layer 24 with a thickness of approximately 10 nm to 20 nm is formed over the substrate 10 by a thermal oxidation or CVD process, covering the floating gates 20 in the memory cell section S1 and the lower electrodes 22 in the capacitor section S2. Next, an n-type polysilicon layer 26 with a thickness of approximately 100 nm to 200 nm is formed on the dielectric (ONO) layer 24 over the entire substrate 10.

After a patterned resist film 32 is formed on the polysilicon layer 26, the polysilicon layer 26 and the dielectric (ONO) layer 24 are selectively etched to define the memory cell section S1 and the capacitor section S2 on the substrate 10 using the film 32 as a mask. The state at this stage is shown in FIG. 8C.

As seen from FIG. 8C, the remaining dielectric layer 24 in the memory cell section S1 forms the second gate dielectric layer 24a and at the same time, the remaining polysilicon layer 26 in the memory cell section S1 forms the control gates 30. The remaining dielectric layer 24 in the capacitor section S2 forms the capacitor dielectric layer 24b. The remaining layer 26 in the section S2 forms the upper electrodes 34 of the capacitors.

Unlike the first embodiment, as seen from FIG. 8D, the depth of the recesses 23 is less than the thickness of the lower electrodes 22 and therefore, each of the lower electrodes 22 is continuous over its whole area. Thus, the capacitor function is generated at the bottoms of the recesses 23 of the lower electrodes 22. This means that there is an additional advantage that the capacitance is further increased (or, the chip area is further decreased) along with the same advantages as those in the first embodiment.

VARIATIONS

It is needless to say that the invention is not limited to the above-described first to third embodiments. Any change may be added to the invention. For example, the plan shape of the capacitors in the capacitor section S2 may be changed optionally. The size, shape and number of the recesses 23 may be changed optionally.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A semiconductor memory device comprising:

(a) a semiconductor substrate with an isolation dielectric;
the isolation dielectric defining active regions on the substrate;

(b) a memory cell section formed on the substrate;
the memory cell section including floating-gate type transistors formed in the active regions;
each of the transistors having a first gate dielectric, a floating gate formed on the first gate dielectric, a second gate dielectric formed on the floating gate, and a control gate formed on the second gate dielectric; and (c) a capacitor section formed on the substrate;
the capacitor section including capacitors formed on the isolation dielectric of the substrate;
each of the capacitors having a lower electrode formed on the isolation dielectric, a capacitor dielectric formed on the lower electrode, and an upper electrode formed on the capacitor dielectric;
a first part of the capacitors being designed to be applied with a first voltage and a second part of the capacitors being applied with a second voltage on operation, where the first voltage is lower than the second voltage;
each of the first part of the capacitors having a recess formed on the lower electrode, thereby increasing its capacitance.

2. The device according to claim 1, wherein the recess of the lower electrode of each of the first part of the capacitors is less than a thickness of the lower electrode.

3. The device according to claim 1, wherein the recess of the lower electrode of each of the first part of the capacitors is approximately equal to a thickness of the lower electrode.

4. The device according to claim 1, wherein the upper electrode of each of the first or second part of the capacitors is narrower than the lower electrode thereof.

5. The device according to claim 1, wherein the upper electrode of each of the second part of the capacitors is narrower than the lower electrode thereof while the upper electrode of each of the first part of the capacitors is not narrower than the lower electrode thereof.

* * * * *